(12) United States Patent
Nakamoto et al.

(10) Patent No.: US 9,865,439 B2
(45) Date of Patent: Jan. 9, 2018

(54) PLASMA PROCESSING APPARATUS

(71) Applicant: Hitachi High-Technologies Corporation, Minato-ku, Tokyo (JP)

(72) Inventors: Shigeru Nakamoto, Tokyo (JP); Tatehito Usui, Tokyo (JP); Satomi Inoue, Tokyo (JP); Kousuke Fukuchi, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 14/851,744

(22) Filed: Sep. 11, 2015

(65) Prior Publication Data
US 2016/0211186 A1    Jul. 21, 2016

(30) Foreign Application Priority Data

Jan. 19, 2015  (JP) .................................. 2015-007360
Jun. 4, 2015   (JP) .................................. 2015-113580

(51) Int. Cl.
*H01J 37/32*  (2006.01)

(52) U.S. Cl.
CPC .. *H01J 37/32972* (2013.01); *H01J 37/32963* (2013.01)

(58) Field of Classification Search
CPC .......... H01J 37/32963; H01J 37/32972; H01J 37/32009; H01L 22/26; H01L 21/3065; H01L 21/308; H01L 22/12
See application file for complete search history.

(56) References Cited

U.S. PATENT DOCUMENTS

2014/0131314 A1* 5/2014 Ando ................ H01J 37/32146
                                                   216/61

FOREIGN PATENT DOCUMENTS

JP        09115883 A  *  5/1997  ........... B24B 37/013
JP        2011-9546 A     1/2011

* cited by examiner

*Primary Examiner* — Yuechuan Yu
(74) *Attorney, Agent, or Firm* — Miles & Stockbridge P.C.

(57) ABSTRACT

A processing apparatus and a processing method for a semiconductor wafer, which allow stable end point detection, are provided. In the plasma processing apparatus or method in which a processing-target film layer of a film structure including a plurality of film layers formed in advance on a surface of a wafer mounted on a sample stage deployed within a processing chamber inside a vacuum vessel, by using plasma formed with the processing chamber, intensities of lights of a plurality of wavelengths are detected using data composed of results of reception of lights during a plurality of different time-intervals by an optical receiver which receives lights of the plurality of wavelengths from an inside of the processing chamber while processing is going.

4 Claims, 14 Drawing Sheets

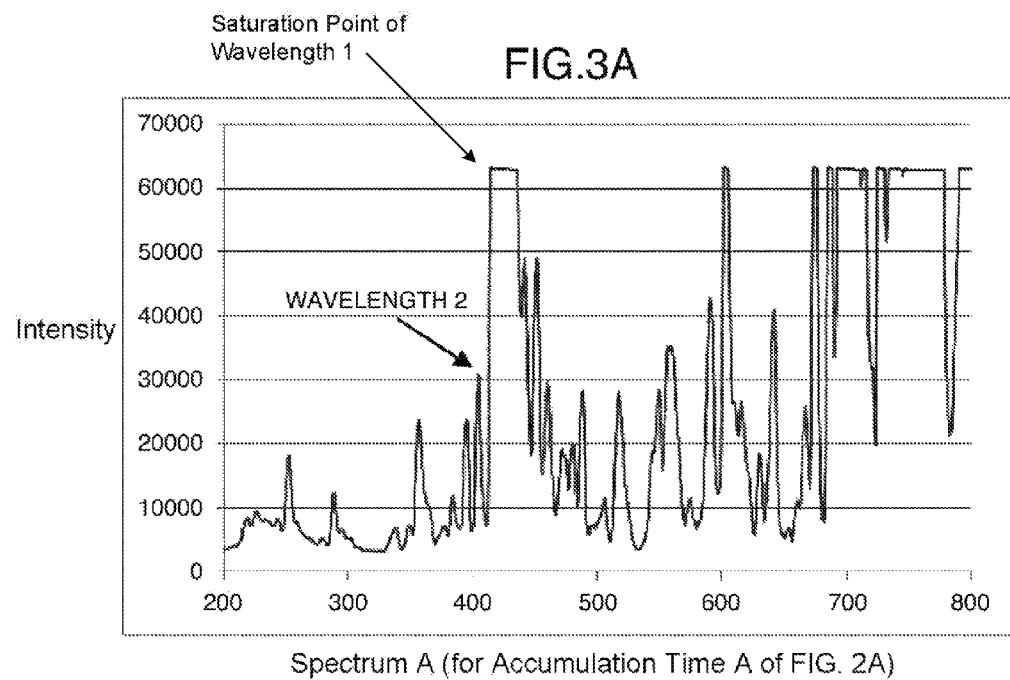
Spectrum A (for Accumulation Time A of FIG. 2A)
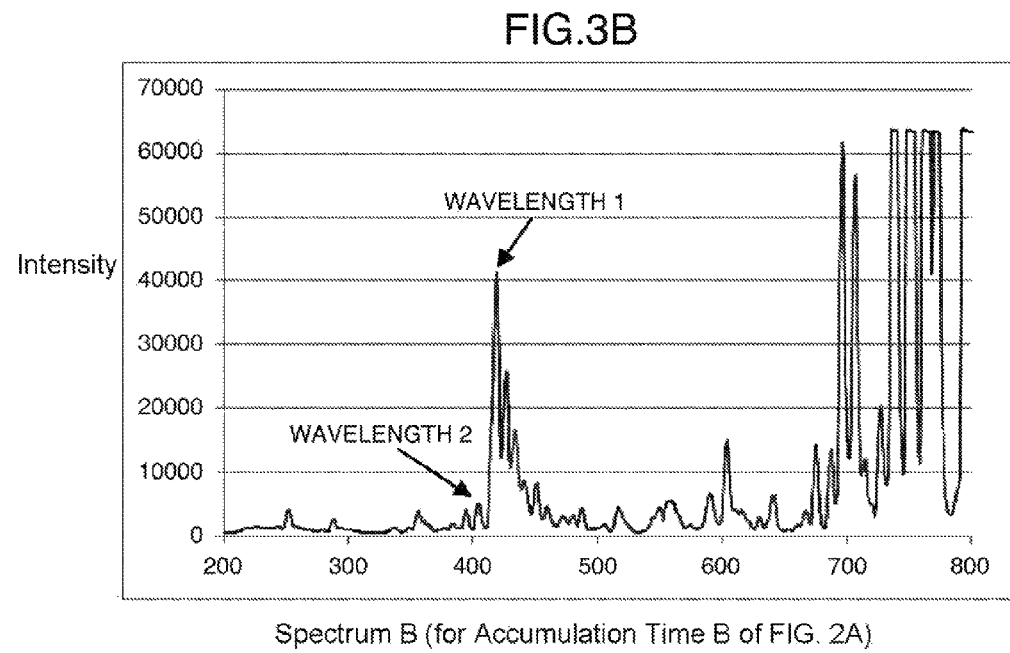
Spectrum B (for Accumulation Time B of FIG. 2A)

FIG.6E PRIOR ART
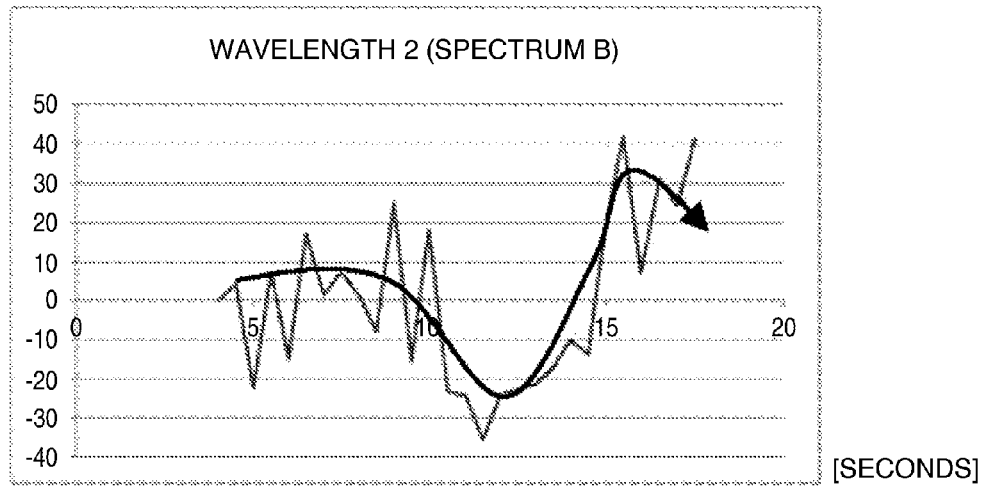
FIG.6F PRIOR ART
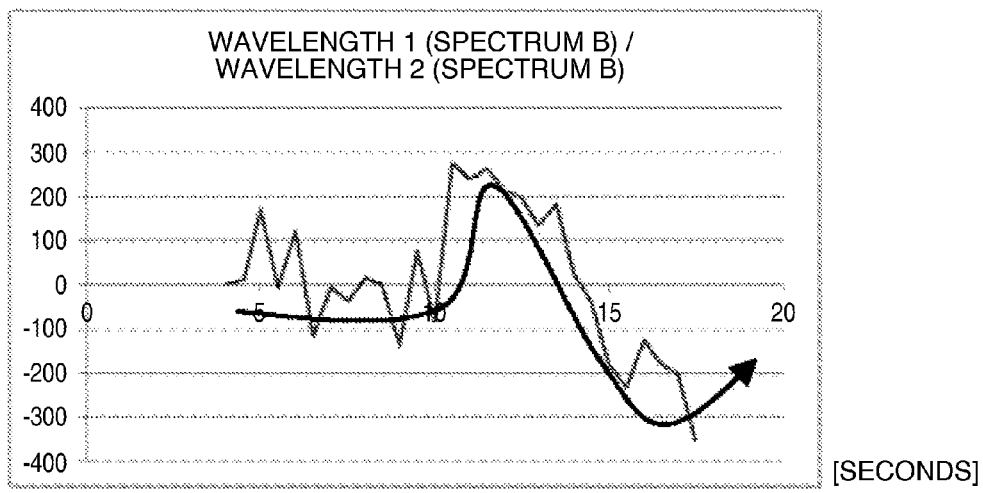
FIG.6G PRIOR ART
| Noise | 170.6 |
|-------|-------|
| Signal | 273.9 |
| S/N | 1.6 |
~ 601

FIG.7E
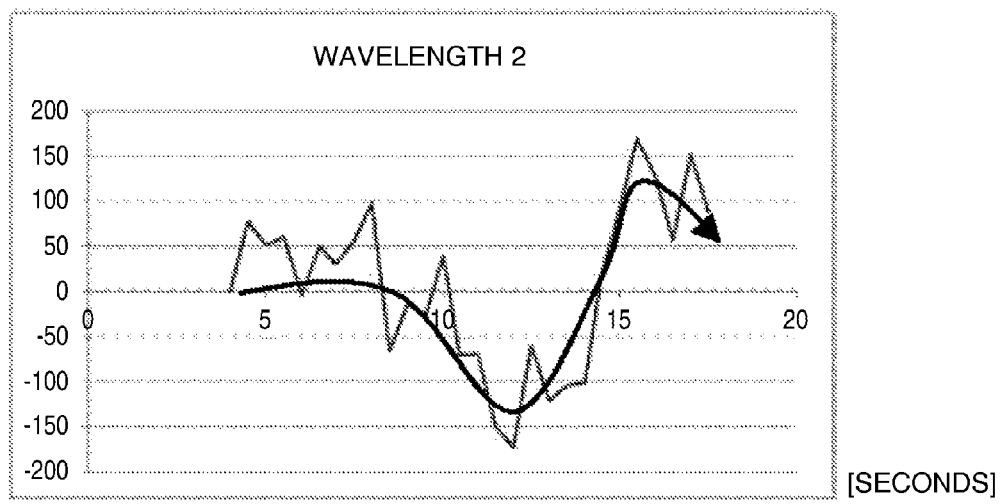
FIG.7F
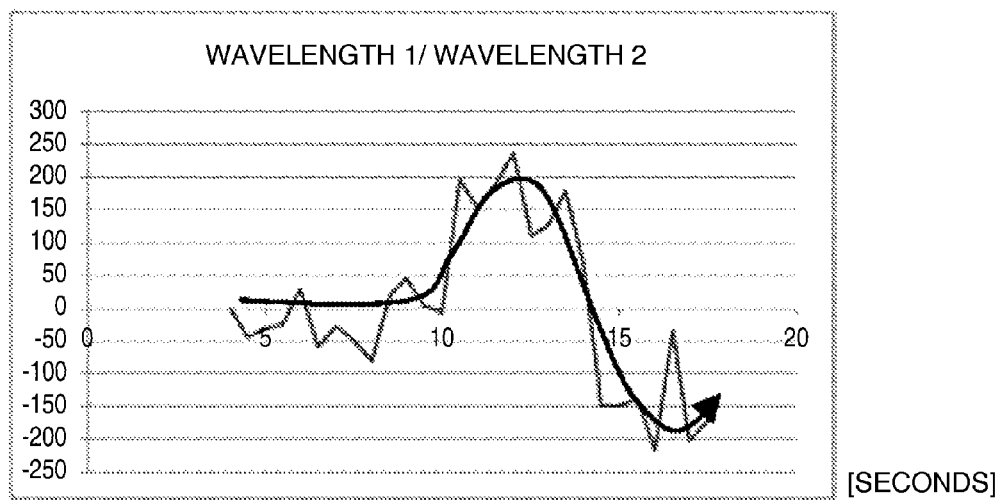
FIG.7G
| Noise | 45.3 |
|---|---|
| Signal | 236.2 |
| S/N | 5.2 | ~701

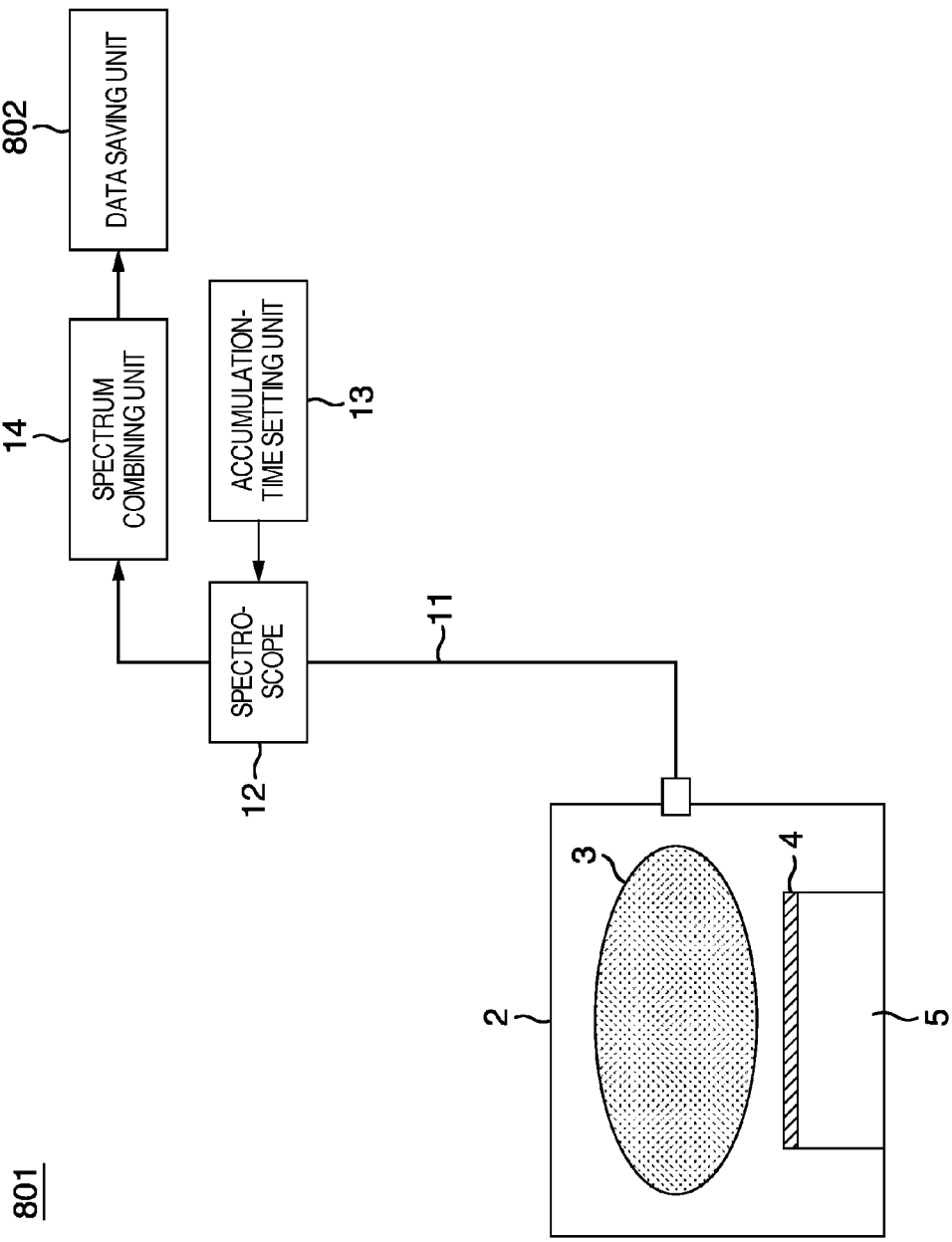

FIG.9A
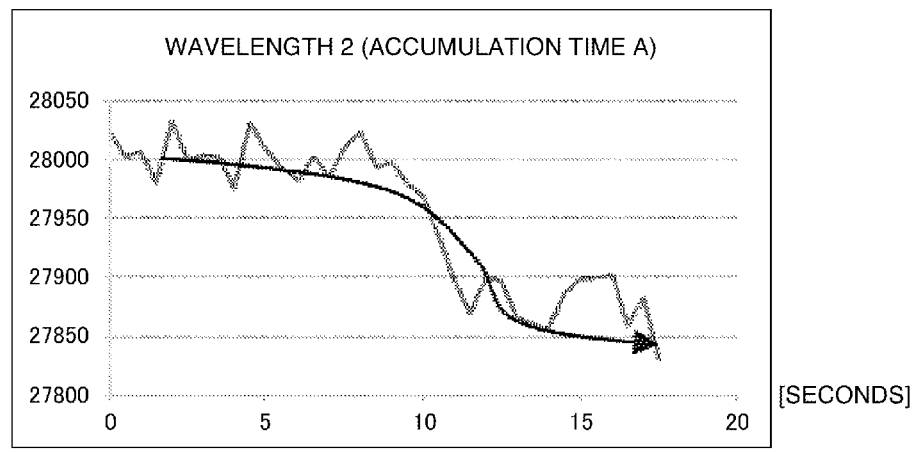
FIG.9B
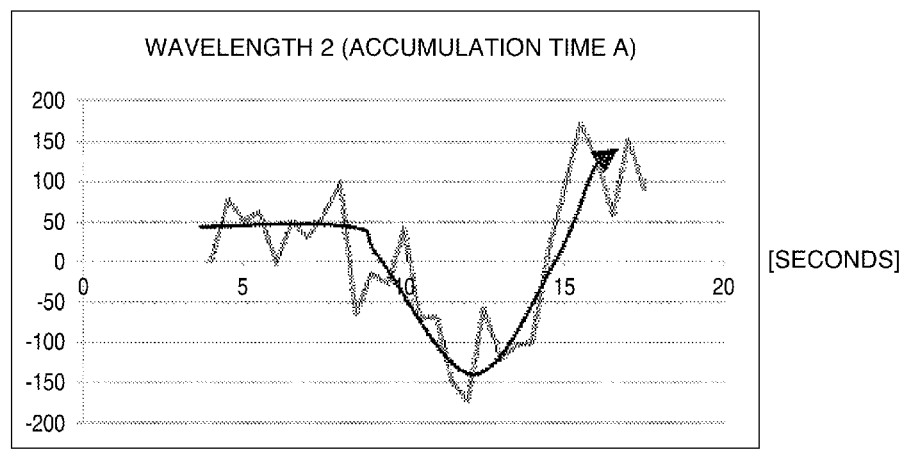
FIG.9C
| Noise | -66.5 |
|---|---|
| Signal | -173.3 |
| S/N | 2.6 |
~ 901

FIG.9D
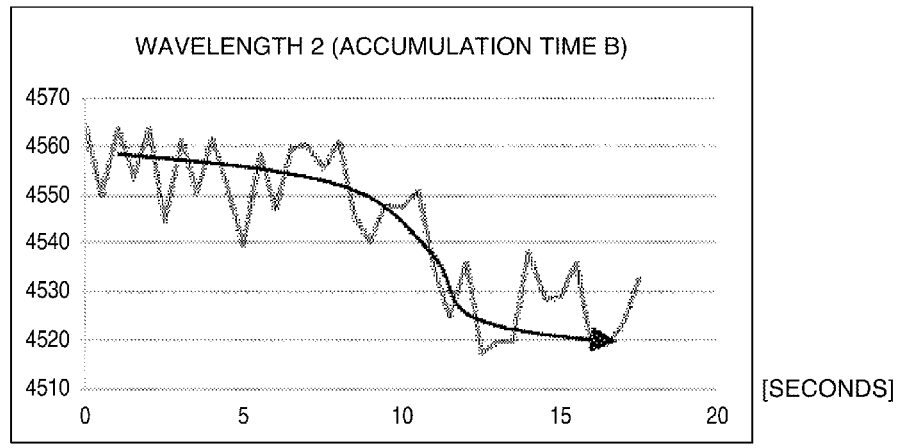
FIG.9E
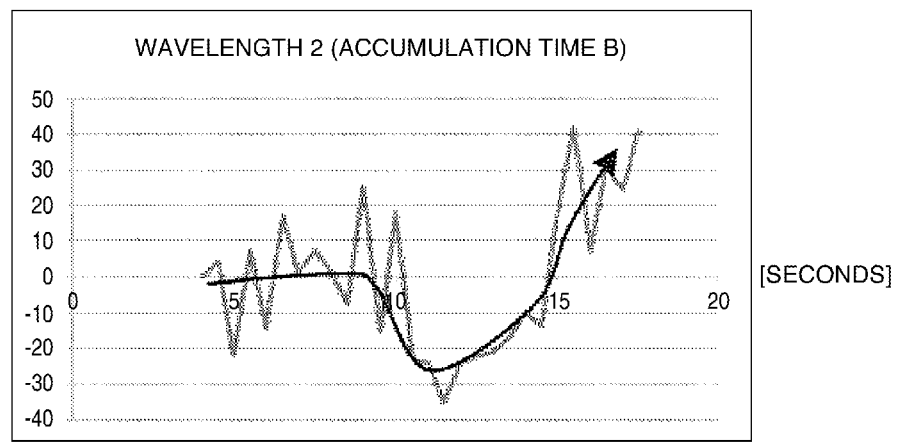
FIG.9F
| Noise | -22.2 |
|---|---|
| Signal | -35.4 |
| S/N | 1.6 |
~902

PLASMA PROCESSING APPARATUS

BACKGROUND OF THE INVENTION

The present invention relates to a plasma processing apparatus for deploying a substrate-like sample such as a semiconductor wafer inside a processing chamber within a vacuum vessel and processing it using plasma formed inside the processing chamber in the fabrication of a semiconductor integrated circuit or the like, in which judgment of the end point of the processing or detection of the state inside the processing chamber during the processing or the characteristics of the processing is performed using a result obtained by detecting the light-emission from the plasma during the processing.

In the fabrication of a semiconductor wafer, dry etching is widely used for the removal or pattern formation of the layers of various materials formed on the surface of the wafer, particularly the layer of dielectric material. In this dry etching, the etching machining of the film to be processed is performed by converting an etching gas introduced into a vacuum processing chamber to plasma to generate ions and/or radicals and causing these ions and/or radicals to react with the film to be processed on the wafer.

During the dry etching processing of the semiconductor wafer, the light-emission intensity of a specific wavelength in the plasma light changes in accompaniment with progress of etching of the film to be processed. Accordingly, as one of the methods for detecting the etching end point of the semiconductor wafer, there has been a method for a long time in which the change in the light-emission intensity of a specific wavelength from the plasma is detected during the dry etching processing and the etching end point is detected, at which the film to be processed is completely removed by etching, based on this detection result.

In the dry etching processing of a wafer of a low opening ratio, on which the exposed area of the material to be etched is small, the change in the light-emission intensity at the etching end point becomes faint. Also, the light-emission intensity of a wavelength of a reaction product produced as the material to be etched is etched decreases at the etching end point.

On the other hand, the light-emission intensity of a wavelength of the etching gas (etchant) increases. In JP-A-2011-009546 or the like, there has been known the method in which faint change in the intensity at the etching end point is increased by doing division between the light-emission intensity of a wavelength of the reaction product and the light-emission intensity of a wavelength of the etchant.

In this prior art, the technology in which, in the etching processing of the low opening ratio wafer or the like in which the change in the light-emission intensity at the etching end point is faint, the faint change in the intensity is amplified by doing division between the signal whose light-emission intensity increases at the etching end point and the signal whose light-emission intensity decreases thereat is disclosed.

SUMMARY OF THE INVENTION

In the above-described prior art, however, a problem has been posed because sufficient consideration is not given to the following point. Namely, when a comparison is made between a signal whose light-emission intensity level is low and a signal whose light-emission intensity level is high, a noise component included in a signal indicating the spectrum at an arbitrary wavelength or frequency becomes relatively large in the former. Therefore, when a difference between the signal intensity in which the light-emission intensity increases at the etching end point and the signal intensity in which the light-emission intensity decreases thereat is significantly large, that is, for example, in the case of the light-emission or the like for a low opening ratio wafer which is subjected to the etching processing, the noise exerts a bad influence on a faint change in the light-emission intensity indicating the end point and it becomes difficult to detect it accurately.

It is an object of the present invention, in consideration of the above-described problem in the prior art, to provide a semiconductor-wafer processing method and processing apparatus for making it possible to detect accurately a faint change in the signal intensity at the etching end point to perform stable end-point detection even in the case where the above-described difference between the light-emission intensities is large.

The above objective can be accomplished with a plasma processing apparatus for processing a processing-target film layer of a film structure including a plurality of film layers disposed in advance on a surface of a wafer mounted on a sample stage which is disposed within a processing chamber inside a vacuum vessel, by using plasma generated within the processing chamber, the plasma processing apparatus including: an optical receiver which receives lights of a plurality of wavelengths from an inside of the processing chamber during a plurality of different time intervals while processing is going; and a detector which is configured to detect data intensities of lights of the plurality of wavelengths from output of the optical receiver using results of reception of lights during a plurality of different time-intervals by the optical receiver, in which the detector is configured to detect data indicating intensities of lights of the plurality of wavelengths during one part of the plurality of different time-intervals using the output from the optical receiver in which the intensity of light of only one of the plurality of wavelengths is not saturated, and to detect data indicating the intensities of lights of the plurality of the wavelengths during another part of the plurality of time-intervals using the output from the optical receiver in which the intensity of lights of each of the plurality of wavelengths is not saturated, and in which the detector is further configured to detect data indicating the intensities of lights of the plurality of wavelengths using the result composed of first data indicating the intensities of lights of the plurality of wavelengths during the one part of the plurality of the time-intervals and the second data indicating the intensity of light of the one of the plurality of wavelengths in which the intensity is not saturated during said another part of the plurality of time-intervals, and which data is multiplied by a ratio of intensities of lights of the one of the plurality of wavelengths in the first data and in the second data.

Also, it is accomplished by a plasma processing method including the steps of: mounting a wafer on a sample stage deployed within a processing chamber inside a vacuum vessel; forming plasma within the processing chamber; processing a processing-target film layer of a film structure including a plurality of film layers formed in advance on a surface of the wafer; and detecting intensities of lights of a plurality of wavelengths by using data composed of results of reception of lights an optical receiver, which receives lights of a plurality of wavelengths from an inside of the processing chamber while processing is going, receives during each of a plurality of different time-intervals.

In the etching where the light-emissions at two or more wavelengths are used for the end-point detection, it is possible to stably perform the end-point detection with a high S/N ratio even when the difference between their light-emission intensities is large.

Other objects, features, and advantages of the invention will become apparent from the following description of the embodiments of the invention taken in conjunction with the accompanying drawings.

BRIEF DESCRIPTION OF THE DRAWINGS

FIGS. 3A and 3B are graphs illustrating spectra which are detected using light from the inside of the processing chamber in the embodiment illustrated in FIG. 1;

FIGS. 6D and 6E are graphs schematically illustrating the second derivatives of the time variations of the signal intensities illustrated in FIGS. 6A and 6B;

FIG. 6F is a graph schematically illustrating the second derivative of the time variation of the ratio illustrated in FIG. 6C;

FIG. 6G is a table showing the S/N ratio of the second derivative of the time variation of the ratio illustrated in FIG. 6C;

FIGS. 7D and 7E are graphs schematically illustrating the second derivatives of the time variations of the signal intensities illustrated in FIGS. 7A and 7B;

FIG. 7F is a graph schematically illustrating the second derivative of the time variation of the ratio illustrated in FIG. 7C;

FIG. 7G is a table showing the S/N ratio of the second derivative of the time variation of the ratio illustrated in FIG. 7C;

FIG. 8 is a diagram schematically illustrating the overview of configuration of a plasma processing apparatus according to another embodiment of the present invention;

FIGS. 9A and 9D are graphs schematically illustrating time variations of intensities of light at a same wavelength during two different accumulation times, respectively;

FIGS. 9B and 9E are graphs schematically illustrating the second derivatives of the time variations of the intensities illustrated in FIGS. 9A and 9D; and FIGS. 9C and 9F are tables showing the S/N ratios of the second derivatives of the time variations illustrated in FIGS. 9B and 9E.

DESCRIPTION OF THE EMBODIMENTS

Figure 1:
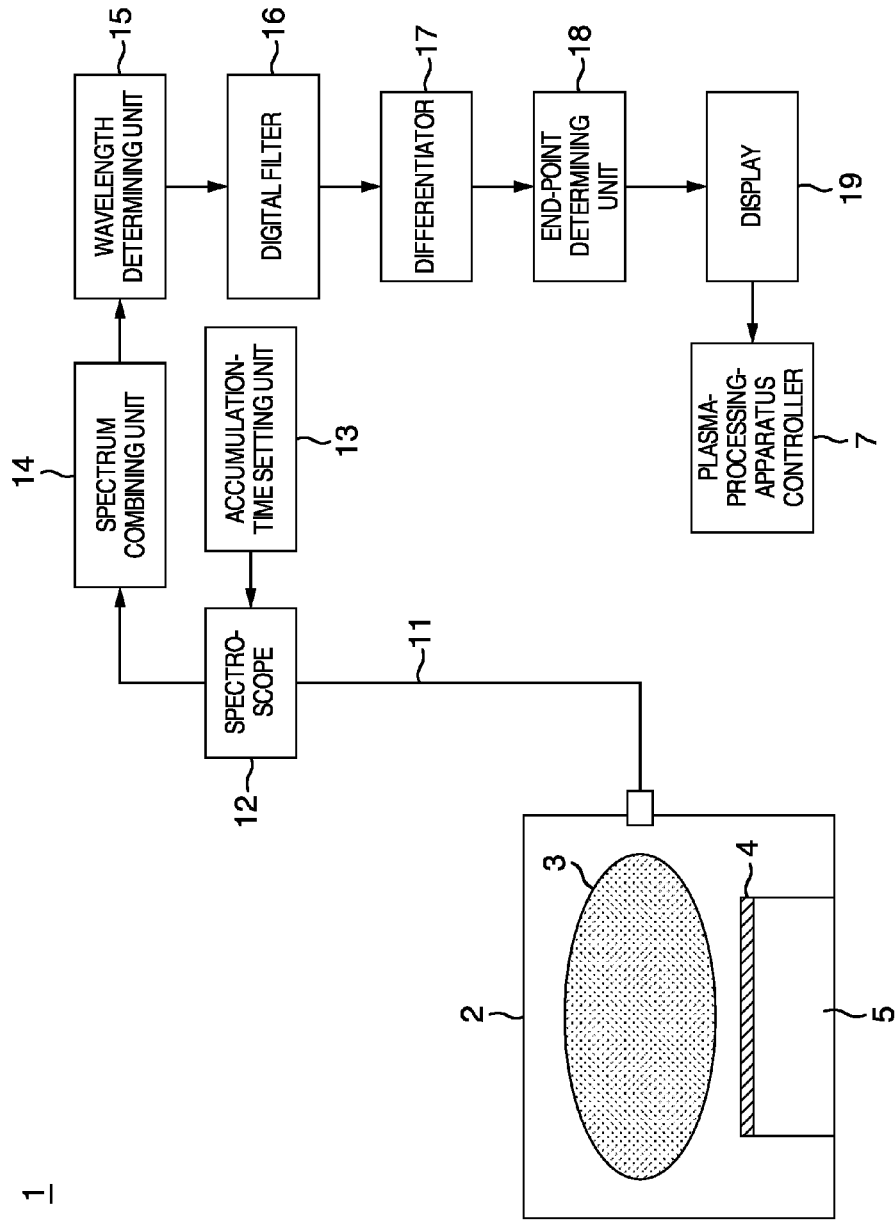
FIG. 1 is a diagram schematically illustrating the overview of configuration of a plasma processing apparatus according to an embodiment of the present invention.

Hereinafter, referring to the drawings, the explanation will be given concerning an embodiment of the present invention.

Embodiment 1

Hereinafter, the present invention will be explained based on the embodiment illustrated in FIG. 1 to FIG. 7G.

FIG. 1 illustrates a plasma processing apparatus according to the present embodiment. FIG. 1 is a diagram schematically illustrating the overview of configuration of the plasma processing apparatus according to the embodiment of the present invention.

The plasma processing apparatus 1 according to the present embodiment includes a vacuum processing chamber 2 which is deployed inside a vacuum vessel, and a sample stage 5 which is deployed toward the bottom on the inner side of the chamber 2 and on which a substrate-like member to be-processed 4 such as semiconductor wafer of the processing target is mounted and supported.

An etching gas, which is introduced into the vacuum processing chamber 2 from a gas introduction unit, which is omitted for illustration, is excited, dissociated, or decomposed by an electric field such as microwave generated by an electric-field generation unit such as a waveguide and/or a flat-plate-like or coil-like antenna (not illustrated) and supplied into the processing chamber 2, or a magnetic field generated by a magnetic-field generation unit such as solenoid coil and supplied into the processing chamber 2, thereby plasma 3 is formed. A processing-target film of the film structure having a plurality of film layers including a mask formed in advance on the upper surface of the member to be processed 4 such as semiconductor wafer on the sample stage 5 is subjected to the etching processing by charged particles within the plasma 3 formed inside the vacuum processing chamber 2 and highly activated particles as being excited therein.

Light-emission, which is radiated from excited particles within the plasma 3, is received by an optical receiver deployed outside through a window constituted from a transparent member deployed in the vacuum vessel constituting the side wall of the vacuum processing chamber 2, and is introduced into a spectroscope 12 through an optical fiber 11 which is optically connected thereto. In the spectroscope 12, the plasma light-emission, which has entered, is subjected to a spectroscopic analysis for each wavelength of a prescribed interval within a range of, for example, 200 nm to 800 nm, and then converted into digital signals each of which indicates intensity of the light at each wavelength by an optical sensor (not shown), which receives the light that is divided to each wavelength.

These signals, each of which indicates the intensity of the light for each of a plurality of wavelengths, are transmitted to a spectrum combining unit 14 and operated to compound the intensity of the light spectrum of a particular wavelength using the intensities of the light spectra of the plurality of wavelengths. Signals which indicate the intensities of the light spectra of the plurality of wavelengths including the calculated intensity of the light spectrum of the particular wavelength are transmitted to a wavelength determining unit 15, so that signals of a plurality of wavelengths that are determined in advance in a recipe or the like as to be used for the end-point detection are extracted from them. The signals output as sampling signals from the wavelength determining unit 15 are stored as time-series data $y_i$, into a memory device such as RAM, which is not illustrated.

This time-series data $y_i$ is subjected to a smoothing processing by a digital filter 16, and stored as smoothed time-series data $Y_i$ into a memory device such as RAM. From this smoothed time-series data $Y_i$, time-series data $d_i$ of differential-coefficient values (that is, first-order derivative values or second-order derivative values) is calculated by a differentiator 17, and stored into a memory device such as RAM.

Here, the explanation will be given regarding the calculation of the differential-coefficient time-series data $d_i$. As the digital filter circuit 16, a low pass filter of the second-order Butterworth type is used, for example. With the low pass filter of the second-order Butterworth type, the smoothed time-series data $Y_i$, is determined from the following Expression (1):

$$Y_i = b_1 \cdot Y_i + b_2 \cdot y_{i-1} + b_3 \cdot y_i - 2 - [a_2 \cdot Y_{i-1} + a_3 \cdot Y_{i-2}] \quad (1).$$

Here, the coefficients $a_n$, $b_n$ (n=1 to 3) are multipliers whose numerical values are different depending on the sampling frequency and the cut-off frequency. For example, as the present example, when the sampling frequency is 10 Hz and the cut-off frequency is 1 Hz, $a_2 = -1.143$, $a_3 = 0.4128$, $b_1 = 0.067455$, $b_2 = -0.013491$, and $b_3 = 0.067455$.

Using the polynomial-adaptation smoothing differential method of the 5-point time-series data $Y_i$, for example, the time-series data $d_i$ of the second-order differential-coefficient values is calculated in the differentiator 17 from the Expression (2) as follows:

$$d_i = \Sigma_{j=-2}^{j=2} w_j \cdot Y_{i+j} \quad (2)$$

Here, in the above example, the weight coefficients $w_j$ (j=−2 to 2) are as follows: $w_{-2}=2$, $w_{-1}=-1$, $w_0=-2$, $w_1=-1$, and $w_2=2$. Also, in the above example, the polynomial-adaptation smoothing differential method is used for the operation by the differentiator 17, but the finite-difference method can also be used.

It is determined in an end-point determining unit 18 whether or not the second-order derivative values (or first-order derivative values) obtained in the differentiator 17 satisfy a condition determined in advance in a recipe or the like. If they are determined to satisfy the condition, the end-point detection is displayed on a display 19 and a controller 7 which is connected in a communicable manner to a detector and each movable portion included in the plasma processing apparatus 1, and adjusts the operations of movable portions is notified. The controller 7, which received this communication, calculates out instruction signals which are needed for starting a next processing step of the member to be processed 4 or terminating the current processing of the member to be processed 4, and transmits this to the gas introduction unit or a plasma generation unit such as a microwave power-supply and a solenoid coil, which are not illustrated.

In the processing of etching the film structure on a low opening ratio wafer as the member to be processed 4, the change in the light-emission intensity from the plasma at the etching end point becomes relatively small. Moreover, depending on the cases, the intensity ratio with noise (S/N ratio) becomes so small down to an extent where it becomes difficult to detect the change in the light-emission intensity.

Also, the light-emission intensity of a wavelength of a reaction product produced as a result of etching of the film material of the etching processing target on the member to be processed 4 decreases at the etching end point. On the other hand, the light-emission intensity of a wavelength of the etching gas (etchant) increases. It has been generally known that the waveform change at the etching end point can be made larger by doing division between the light-emission intensity of a wavelength of the reaction product and the light-emission intensity of a wavelength of the etchant.

Figure 2A:
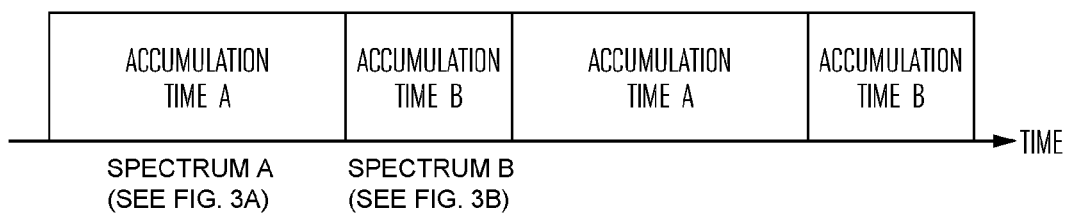
FIG. 2A is a diagram illustrating a setting of time intervals during which a spectroscope of the embodiment illustrated in FIG. 1 receives light from the inside of a processing chamber.
Figure 2B:
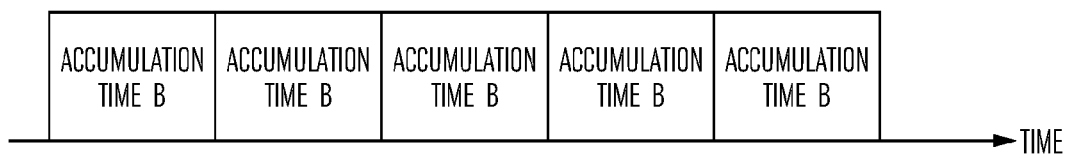
FIG. 2B is a diagram illustrating a setting of time intervals during which a spectroscope of a prior art receives light from the inside of a processing chamber.
Figure 6A:
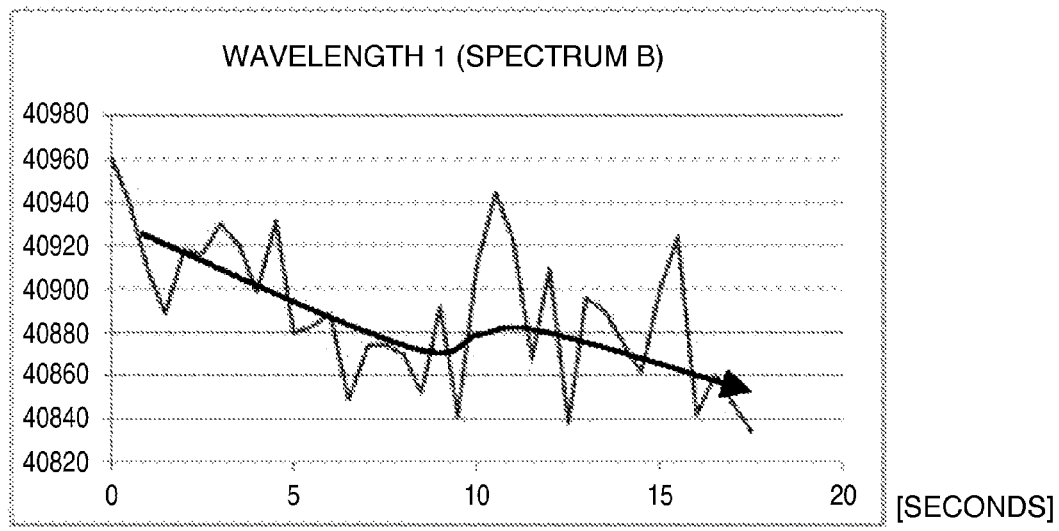
FIGS. 6A and 6B are graphs schematically illustrating time variations of signal intensities at two wavelengths around the end point of the processing acquired in the prior art.
Figure 6B:
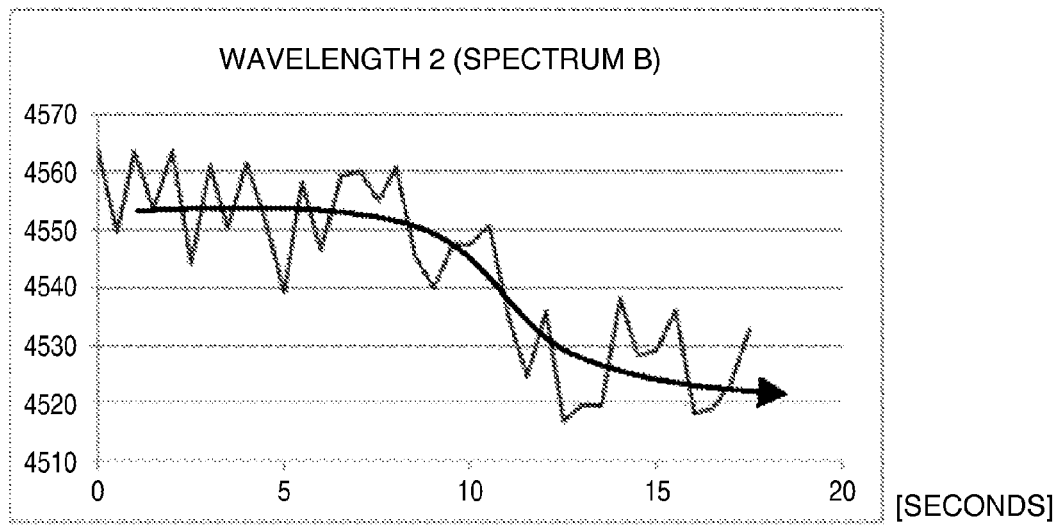

Here, referring to FIGS. 2A, 2B, 3A, 3B, and 6A to 6G, the explanation will be given concerning the configuration in which the end point is detected in the prior art. FIGS. 2A and 2B are diagrams illustrating the settings of time intervals during which spectroscopes of the embodiment illustrated in FIG. 1 and the prior art receive light from the inside of the processing chamber, respectively. FIGS. 3A and 3B are graphs illustrating a sample of a light-emission spectrum which is detected using light from the inside of the processing chamber by a spectroscope in the embodiment illustrated in FIG. 1 and of the prior art. FIGS. 6A to 6B are graphs schematically illustrating time variations of signal intensities at two wavelengths around the end point of the processing acquired in the prior art.

FIG. 2B is the diagram for illustrating the setting of time intervals during which the spectroscope of the prior art receives light from the inside of the processing chamber. Namely, in the prior art, light-emission-related data is detected which is obtained as a result of separating the entire time-interval and continuously receiving the light-emission spectrum data in the spectroscope 12, and FIG. 2B schematically illustrates a series of time-intervals (which are referred to as "accumulation times" in the diagram) as units in which the light-receiving sensor of the spectroscope receives the light-emissions, which vary along with a lapse of the processing time, during the etching processing of the member to be processed 4.

As illustrated in FIG. 2B, in the prior art, the change in the light-emission spectrum of the plasma is detected by continuously receiving the light during the same accumulation time B, and continuously acquiring the light-emission spectrum for each accumulation time B. Here, the explanation will be given below regarding the accumulation time of the multi-channel spectroscope using a CCD sensor or the like, In the multi-channel spectroscope 12, during an accumulation time, the optical sensor receives light of a prescribed wavelength of the dispersed light-emission of the plasma to accumulate electric charges inside the sensor or its circuit; the amount of charged electric charge is then output after the end of the accumulation time. The amount of electric charge for each wavelength, which is determined in advance like this, can represent the light-emission spectra illustrated in FIG. 3A and FIG. 3B, for example, with the wavelength as their parameter. The relationship between the accumulation time and the output amount of the electric charge is a substantially proportional relationship and, accordingly, doubling the accumulation time results in the doubling of the output amount of the electric charge.

FIG. 3B illustrates an example (light-emission spectrum B) of the spectrum which is obtained from the light-emission during the etching processing in the prior art. In FIG. 3B, at Wavelength 1, the light-emission intensity increases at the etching end point, while, at Wavelength 2, the light-emission intensity decreases at the etching end point.

FIGS. 6A and 6B are graphs schematically illustrating time variations of the signal intensities at two wavelength around the end point of the processing acquired in the prior art shown in FIGS. 2A to 3B. FIGS. 6D and 6E are graphs schematically illustrating the second derivatives of the time variations of the signal intensities illustrated in FIGS. 6A and 6B.

As illustrated in FIG. 6A, the light intensity of the spectrum of Wavelength 1 contains a noise and increases/decreases in accompaniment with a variation in time, and increases slightly at the etching end point. On the other hand, as illustrated in FIG. 6B, the light intensity of the spectrum of Wavelength 2 contains a noise and increases/decreases in accompaniment with a variation in time, and decreases slightly at the etching end point.

Figure 6C:
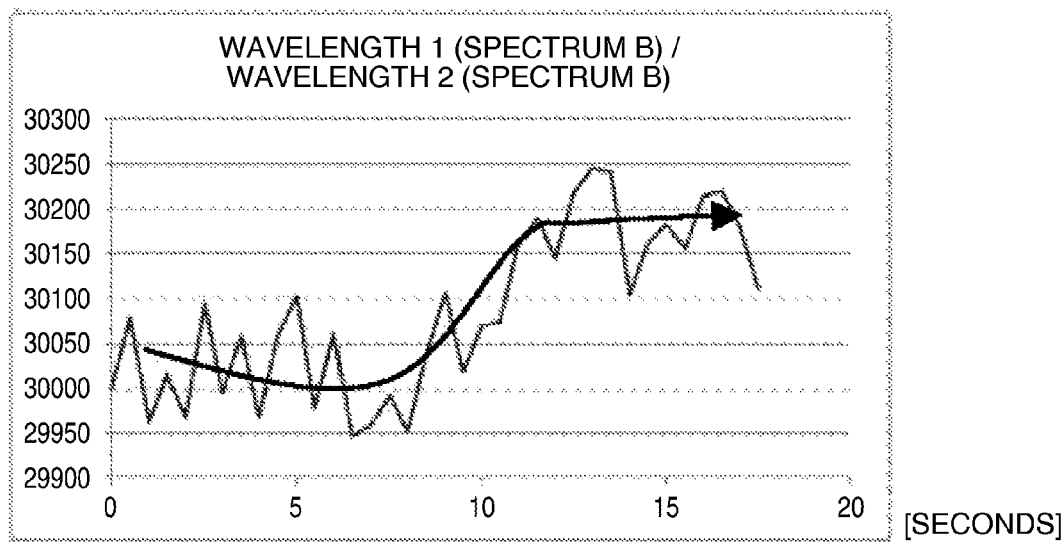
FIG. 6C is a graph schematically illustrating the ratio of the signal intensities illustrated in FIGS. 6A and 6B.
Figure 6D:
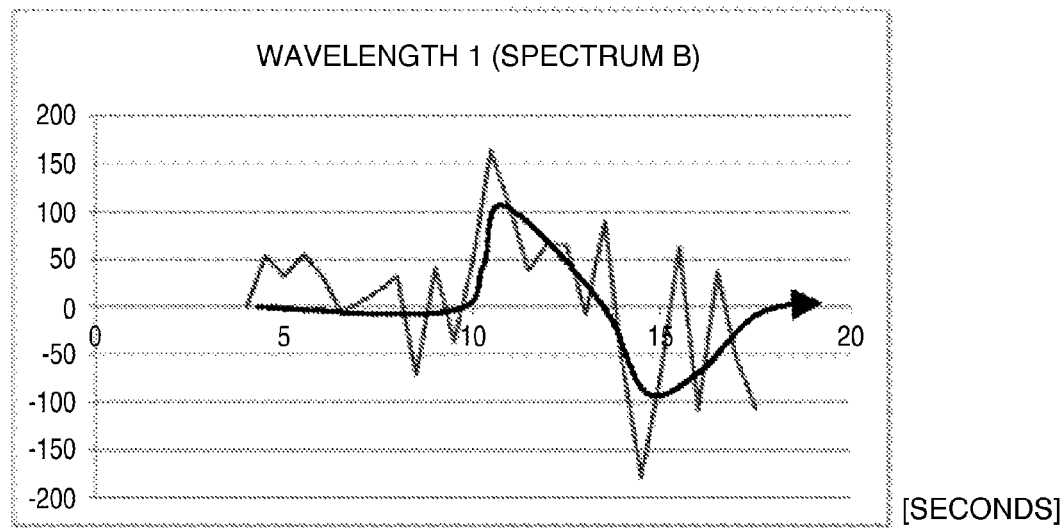

FIG. 6C illustrates time variations when division is done between the intensities of light at these two wavelengths at each time. For convenience, as illustrated in FIG. 6C, the division data is normalized to 30,000 counts. FIG. 6F illustrates the second-order derivative values of this division data.

In these diagrams, it can be regarded that, as indicated by smoothed arrow lines, the changes at the etching end point occur at 10 seconds. When the maximum value of the second-order derivative of the division data at the etching end point is defined as a signal, this signal is 273.9. Also, the value at before 10 seconds can be defined as a noise amount, and this noise amount is 170.6. Accordingly, the S/N ratio of the second-order derivative value in this etching processing becomes 1.6.

These parameters are indicated in a table in summary as FIG. 6G. According to the investigations by the inventors, the criterion of the S/N ratio with which the end-point detection can be stably carried out is usually 4.0 or greater and, in accordance with this criterion, such the stable end-point detection is not possible in the prior art.

Next, referring to FIGS. 2A, 3A, 3B, 4, 5, and 7A to 7G, the explanation will be given concerning the configuration in which the end point of the etching processing is detected in the present embodiment.

Although repeating again, FIG. 3B illustrates a light-emission spectrum obtained from the plasma light-emissions during the etching processing. In FIG. 3B, the light-emission intensity of Wavelength 1 increases at the etching end point, whereas the light-emission intensity of Wavelength 2 decreases at the etching end point. Also, the light-emission intensity of Wavelength 1 is high and that of Wavelength 2 is relatively low. Since the noise in the circuit inside the spectroscope 12 does not depend on the light-emission intensity of the plasma, it is known that a proportion of the noise becomes large in the signal of the spectrum of a wavelength, at which the light-emission intensity detected by the optical sensor and output at the spectroscope 12 is low, and the S/N ratio is low.

Therefore, in the present embodiment, in order to enhance the light-emission intensity of Wavelength 2, the light-emission intensities are detected in the spectroscope 12 by alternately repeating a plurality of different accumulation times. Namely, as illustrated in FIG. 2A, a relatively long accumulation time A and the short accumulation time B are repeated alternately and continuously in the spectroscope 12 when the light from the inside of the processing chamber is received by the optical sensor.

FIG. 3A illustrates the result of detection of the light-emissions using the light-reception pattern illustrated in FIG. 2A. The pattern is set in an accumulation time setting unit 13 in FIG. 1. As seen in FIG. 3A, in the light-emission spectrum detected (light-emission spectrum A), the light-emission intensity becomes high at Wavelength 2, and the S/N ratio becomes better. However, it was found that, as illustrated in the same figure, if the time-interval of the accumulation time A becomes longer than a prescribed value, the spectrum value at Wavelength 1 exceeds a limit of electric charge which can be accumulated in the optical sensor, and thus the output becomes saturated.

As illustrated in the figures, the saturated output becomes data in the area of a frequency or wavelength at which the output data represents the largest possible value and a constant value, so that values of the intensity of the light at the wavelength at which the data is supposed to exhibit a value larger than the above-described maximum value is not output or displayed. In the present embodiment, consideration is given so that this undisplayed output or not-output values are formed by being complemented or compounded using data detected with use of results which are obtained in the spectroscope 12 by dispersing the light received in a different accumulation time, for example, a shorter time-interval.

Thus, in the present embodiment, the light-emission is received and detected continuously while the accumulation time A and the accumulation time B are repeated alternately, thereby acquiring the intensity distribution of the spectrum corresponding to each of the accumulation times. Namely, the spectrum distribution data illustrated in each of FIGS. 3A and 3B is detected.

In the present embodiment, in the spectrum combining unit 14, the intensity signals of the different values of light-emission during the same processing at the different wavelengths, such as Wavelength 1 where the light-emission intensity is high and Wavelength 2 where the light-emission intensity is low, respectively, are detected from the above-described data on the light-emission intensity spectra obtained during the same processing and the different time-intervals. Moreover, using these light-emission spectra, a combined spectrum is calculated, in which the saturated area of the light-emission spectrum (spectrum A) where the signal of the intensity at Wavelength 1 becomes saturated in the accumulation time A is compounded to complement.

Figure 4:
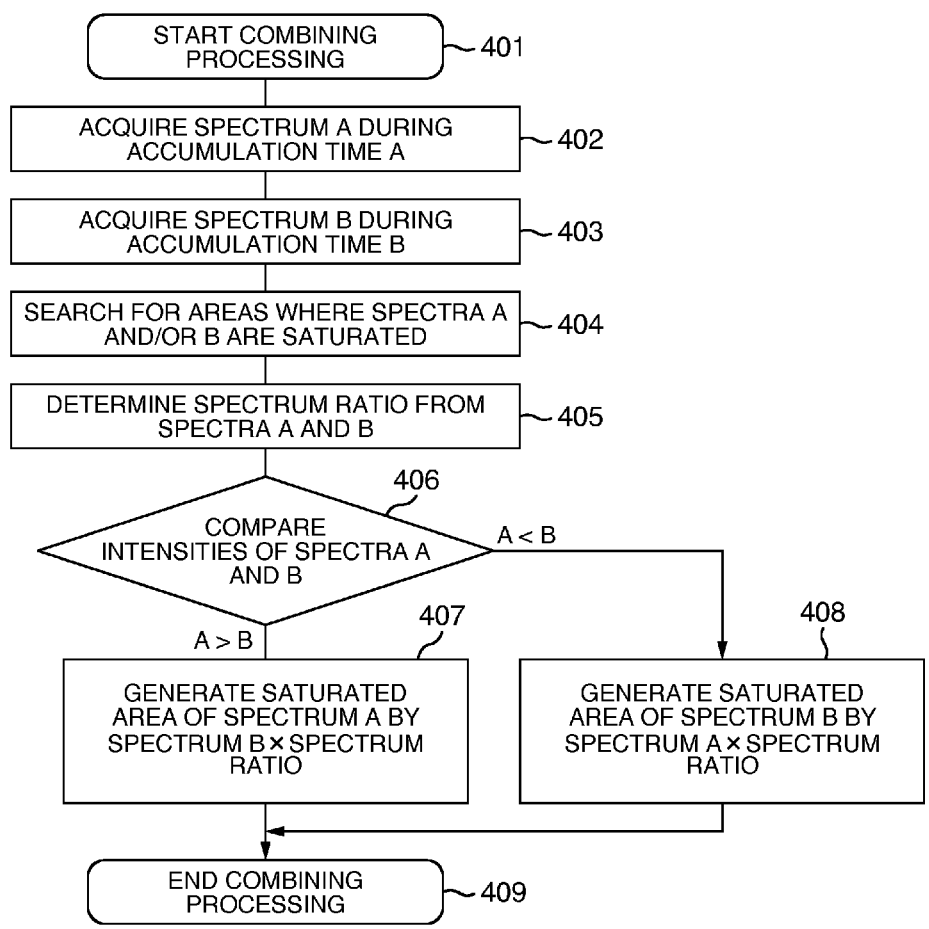
FIG. 4 is a flowchart indicating the outline of the flow of a processing for combining spectra detected in the embodiment illustrated in FIG. 1.

Now, referring to FIG. 4, the explanation will be given regarding the calculation algorithm of the combined spectrum. FIG. 4 is a flowchart indicating the outline of the flow of a processing for combining the spectra detected in the embodiment illustrated in FIG. 1 to complement.

First, at Step 401, the processing is started and, thereafter, the light-emission spectrum A is detected by receiving the light-emission from the plasma inside the processing chamber by the optical receiver during the time-interval of the accumulation time A (Step 402). Next, the light-emission spectrum B is detected during the time-interval of the accumulation time B which follows the accumulation time A (Step 403).

Next, areas in which the light-emission spectra A and/or B are saturated are detected (Step 404). After that, at Step 405, the spectrum ratio between the light-emission spectra A and B is determined from them.

In the calculation method of the spectrum ratio, the ratio between peaks of high light-emission intensities which are not saturated in the light-emission spectra A and B is used. Otherwise, the ratio between average values may also be used which are of the entire or partial light-emission intensities of the areas that are not saturated in the light-emission spectra A and B.

Figure 5:
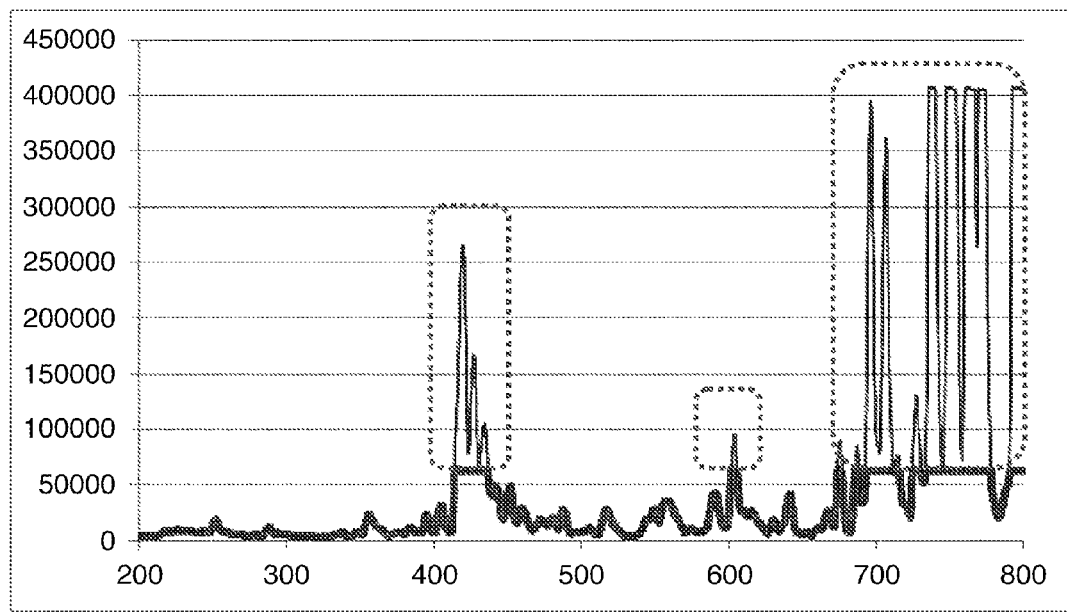
FIG. 5 is a graph illustrating an example of the spectrum which is obtained as a result of the processing illustrated in FIG. 4.

At Step 406, the comparison is made between the intensities of the light-emission spectra A and B, and the combined spectrum illustrated in FIG. 5 is calculated by compounding the saturated area of the spectrum whose light-emission intensity is high by a value which is obtained by multiplying the spectrum whose light-emission intensity is low by the spectrum ratio determined at Step 405 (Steps 407, 408).

Figure 7A:
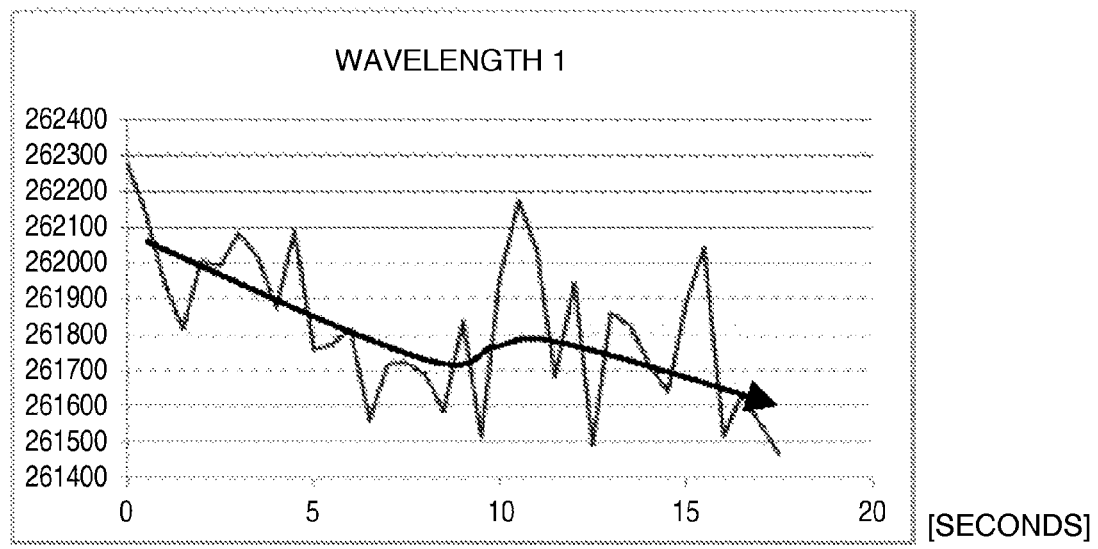
FIGS. 7A and 7B are graphs schematically illustrating time variations of signal intensities at two wavelengths around the end point of the processing acquired using the combining processing associated with the embodiment illustrated in FIG. 1.
Figure 7B:
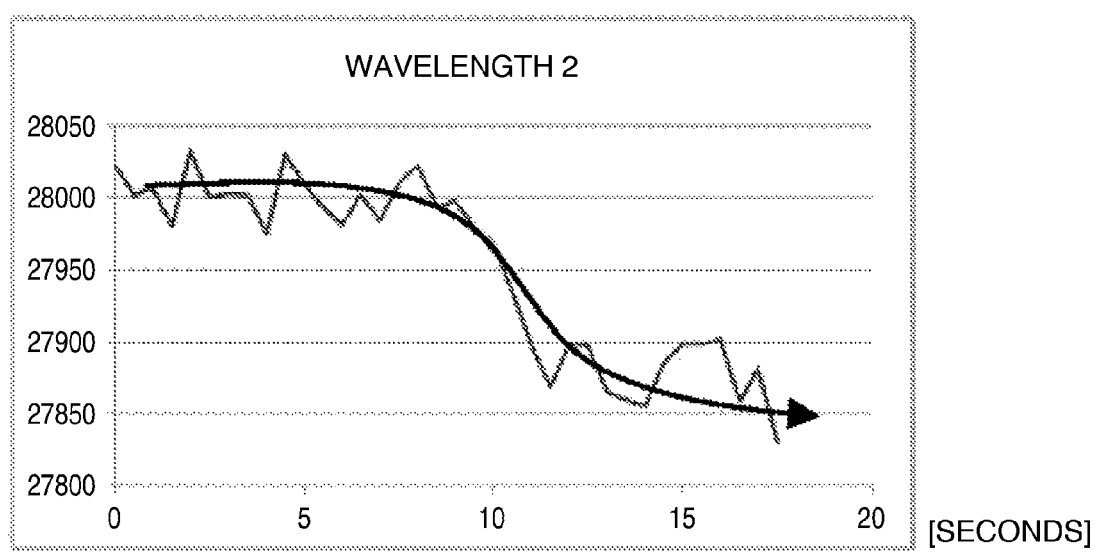
Figure 7C:
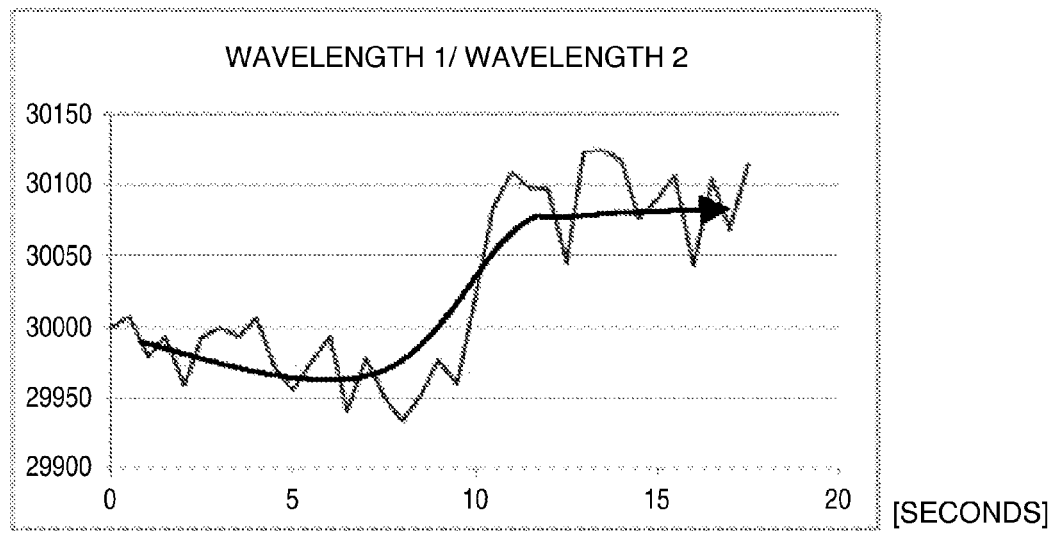
FIG. 7C is a graph schematically illustrating the ratio of the signal intensities illustrated in FIGS. 7A and 7B.
Figure 7D:
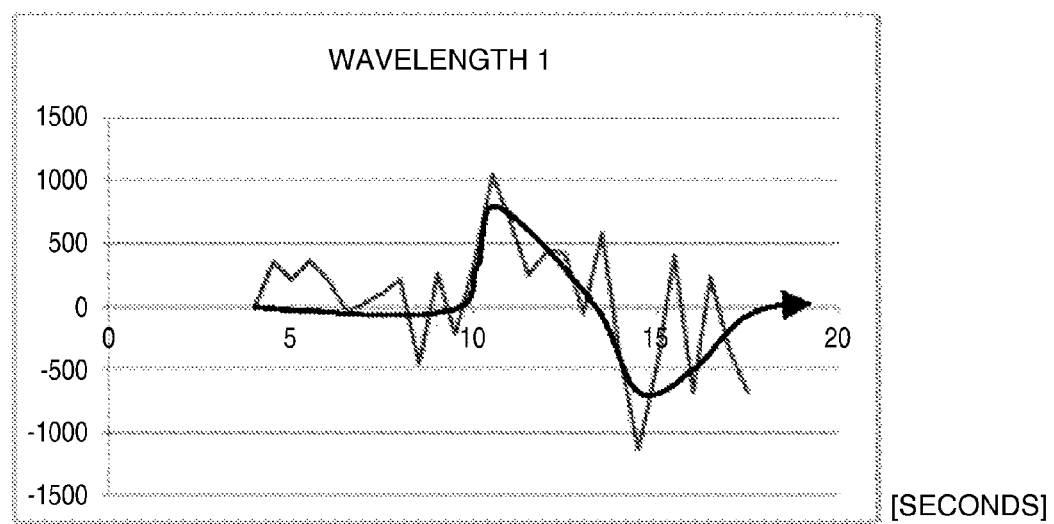

FIGS. 7A to 7C illustrate the respective light-emission intensities at the plurality of wavelengths in the combined spectrum, and the ratios therebetween. FIGS. 7A and 7B are graphs schematically illustrating time variations of signal intensities at two wavelengths around the end point of the processing acquired as combining the spectra associated with the embodiment illustrated in FIG. 1. FIGS. 7A and 7D, FIGS. 7B and 7E, and FIGS. 7C and 7F illustrate time variations in the light-emission intensities and time variations of their second-order derivative values, at Wavelength 1, Wavelength 2, and in the ratio of at Wavelength 1 to at Wavelength 2, respectively.

In the figures, the second-order derivative value at Wavelength 1 (FIG. 7D), the second-order derivative value at Wavelength 2 (FIG. 7E), and the second-order derivative value of the ratio of at Wavelength 1 to at Wavelength 2 (FIG. 7F) are illustrated. The changes at the etching end point occur at 10 seconds as seen in FIGS. 7C and 7F. When the maximum value of the second-order derivative of the division data at the etching end point is defined as a signal, this signal is 236.2. Also, the value at before 10 seconds can be defined as a noise amount, and this noise amount is 45.3. Accordingly, the S/N ratio of the second-order derivative value at this etching becomes 5.2.

These parameters are indicated in a table in summary as FIG. 7G. As described earlier, the criterion of the S/N ratio with which the end-point detection can be stably carried out is usually 4.0 or greater and it can be seen that the end point of the present etching can be stably detected.

In the above-described embodiment, the light-emission spectrum is detected by the spectroscope 12; the present invention, however, is not limited to such the configuration and the spectrum combining unit 14 may have a function of receiving a signal indicating the amount of electric charge accumulated during the accumulation time and output by the optical sensor of the spectroscope 12 and detecting a spectrum prior to combining based on this. Also, the accumulation time may be able to be set arbitrarily by a user of the plasma processing apparatus 1 using an instruction device such as computer terminal equipped with a display (not illustrated) or may be set by the apparatus controller 7, which receives information on the processing condition (so-called recipe) in accordance with an algorithm or data such as a table determined in advance in correspondence with this information.

As having been explained so far, when the end-point detection is performed using two or more wavelengths at which the light-emission intensities are different from each other, the S/N ratio in the time variation in the light-emission intensity of each wavelength can be enhanced by respectively setting the accumulation times of the CCD sensor so that the light-emission intensity at each wavelength becomes higher (substantially higher than the half of the saturation capacity), and the end-point detection can be performed with a high S/N ratio by doing division between them.

Also, the light-emission spectra A and B during the etching processing can be integrated into a single spectrum by calculating to combine the spectra. Although not illustrated, this makes it possible to reduce the storage area to a main storage device such as HD.

Embodiment 2

Next, referring to FIGS. 8 and 9A to 9F, the explanation will be given regarding another embodiment of the present invention. FIG. 8 is a diagram schematically illustrating the overview of configuration of a plasma processing apparatus according to another embodiment of the present invention. FIGS. 9A to 9F are graphs and related tables, schematically illustrating signals at a single wavelength around an end point of a processing obtained from spectra associated with the embodiment illustrated in FIG. 8.

A plasma processing apparatus 801 illustrated in FIG. 8 is identical to the plasma processing apparatus 1 illustrated in FIG. 1 in its major configuration components. In the embodiment illustrated in FIG. 1, the output from the spectrum combining unit 14 is transmitted to the wavelength determining unit 15, a result obtained by differentiating this transmitted data is thereafter transmitted to the end-point judging unit 18, where the end point is judged, and the judgment result is displayed on the display; in the present embodiment, however, there is provided a data saving unit 802 which is connected with the spectrum combining unit 14 in a communicable manner and includes in its inside a storage device such as hard disc drive, a removable disc drive such as CD-ROM, or a memory device such as RAM or flash ROM, so that the output from the spectrum combining unit 14 is transmitted to the data saving unit 802 and the received signal data is stored in the storage device inside.

In the present embodiment as well, a single combined spectrum is calculated in the spectrum combining unit 14 using a plurality of wavelength spectra received and detected with the accumulation times during which the light or the signals indicating their intensities are accumulated being different from each other. In the data saving unit 802, which receives signals indicating the above-described combined spectra output from the spectrum combining unit 14, the signal data are stored and saved in an auxiliary storage device such as hard disc or a memory device such as RAM.

In the present embodiment, data acquired as a plurality of wavelength data from the spectroscope 12 in a time-sequence manner is referred to as an "OES data"; using data of a predetermined wavelength in the combined spectrum which is also contained in this OES data, an analysis is made for the state inside the vacuum processing chamber 2 during the processing, or the characteristics and conditions of the processing using plasma. In accompaniment with high integration and high complexity of a semiconductor device, an area of a to-be-processed material (i.e. an opening) on the semiconductor wafer is becoming smaller and a change in the light-emission intensity or its wavelength distribution of the plasma in a time-interval around (and including) an end point of a processing of the to-be-processed material during the plasma processing is getting very faint. Under these conditions, when an analysis of an OES data is performed in order to detect a particularly infinitesimal change, the S/N ratio of the light-emission data at each wavelength is tremendously important for enhancing its accuracy.

In the present embodiment as well, similar to the embodiment illustrated in FIG. 1, the spectroscope 12 outputs the amount of electric charge which is charged by the plasma light that is dispersed only during a specified accumulation time. This electric-charge amount is shown as the light-emission spectra illustrated in FIGS. 3A and 3B, for example.

The relationship between the accumulation time and the electric-charge amount is a substantially proportional relationship and doubling the accumulation time results in doubling of the output electric-charge amount. In the present embodiment as well, by receiving light with regard to respective lights of a plurality of wavelengths acquired by being dispersed in the spectroscope 12 in such a manner that different accumulation times A and B are repeated by a prescribed number of times, corresponding spectra A and B are detected, respectively. Similar to those illustrated in FIGS. 3A and 3B, the detected spectrum A becomes a spectrum in which the light intensity at Wavelength 1 is saturated but not at Wavelength 2 and the spectrum B becomes a spectrum in which neither of the light intensities at Wavelengths 1 and 2 is saturated.

Referring to FIGS. 9A to 9F, the explanation will be given concerning a time variation in the data which indicates the intensity of the light of Wavelength 2 among the plurality of wavelengths constituting the spectra detected in the present embodiment. FIGS. 9A, 9B, 9D, and 9E are the graphs schematically illustrating examples around an end point of a processing, in which the light of Wavelength 2 in spectra is detected by the plasma processing apparatus according to the embodiment illustrated in FIG. 8.

The graph in FIG. 9A illustrates an example of the time variation of the intensity of the light at a predetermined Wavelength 2 received in the accumulation time A. The graph in FIG. 9D illustrates the time variation of the intensity of the light at Wavelength 2 received in the accumulation time B. FIGS. 9A and 9D illustrate the light-emission intensities of the plasma and FIGS. 9B and 9E illustrate their second-order derivatives, respectively.

In each of these graphs, a variation at around 10 seconds in the abscissa corresponds to the termination point (end point) of etching. The second-order derivatives are calculated in order to evaluate ratios between the variation in the light-emission intensity in the time-intervals around and including this end point and a fluctuation (i.e., noise) component before 10 seconds. Then, results of calculation of the S/N ratios with the fluctuation before 10 seconds in the second-order derivatives as the noise component and with the variation after 10 seconds as the signal component are indicated altogether as Tables 901 and 902 in FIGS. 9C and 9F, respectively. As indicated in Tables 901 and 902 in these figures, the S/N ratio of the data associated with the accumulation time A becomes 2.6, and the S/N ratio in the accumulation time B becomes 1.6.

The case where Wavelength 1 and Wavelength 2 are used for the analysis is considered. Since the noise of circuits inside the spectroscope 12 does not depend on the light-emission intensity, a signal of low light-emission intensity contains a high proportion of the noise and thus its S/N ratio is low. Then, in order to increase the light-emission intensity at Wavelength 2, the light-emission spectrum A is acquired with the accumulation time of the spectroscope 12 made longer; the light-emission intensity at Wavelength 2 becomes higher and the S/N ratio is enhanced when compared with the case of Wavelength 2 of the light-emission spectrum B, but there may occur the case where Wavelength 1 becomes saturated.

Therefore, in the present embodiment as well as illustrated in FIG. 2A, the accumulation time A and the accumulation time B are repeated and two of a light-emission spectrum A and a light-emission spectrum B are detected which correspond to the respective accumulation times, as is the case with those illustrated in FIGS. 3A and 3B. This makes it possible to detect OES data which includes both of the data of Wavelength 1 whose light-emission intensity is high and the data of Wavelength 2 whose S/N ratio is high.

When the two sets of OES data acquired as described above are stored, the capacity required for the stored data becomes twice as large. Moreover, when analyses are made concerning the state inside the vacuum processing chamber 2 during the processing or the characteristics and conditions of the processing using plasma with use of a predetermined wavelength of the combined spectrum within the OES data, it becomes necessary to analyze the data associated with the lights of Wavelengths 1 and 2 in the same light-intensity range.

Thus, in the present embodiment, a single set of combined OES data is created from two or more sets of OES data which, as described above, are detected with different accumulation times in the spectroscope 12. The processing flow for calculating such the combined OES data is the same as the flowchart illustrated in FIG. 4.

Namely, after the processing is started at Step 401, the light-emission spectrum A is detected by receiving the light-emission from the plasma inside the processing chamber by the optical receiver during the time-interval of the accumulation time A (Step 402). Next, the light-emission spectrum B is detected during the time-interval of the accumulation time B which follows the accumulation time A (Step 403).

Next, areas saturated in the light-emission spectra A and B are detected (Step 404). After that, at Step 405, the spectrum ratio between the light-emission spectra A and B is determined from them.

In the calculation method of the spectrum ratio, the ratio between peaks of high light-emission intensities which are not saturated in the light-emission spectra A and B is used. Otherwise, the ratio between average values may also be used which are of the entire or partial light-emission intensities of areas that are not saturated in the light-emission spectra A and B.

At Step 406, the comparison is made between the intensities of the light-emission spectra A and B, and the combined spectrum illustrated in FIG. 5 is calculated by compounding the saturated area of the spectrum whose light-emission intensity is high by a value which is obtained by multiplying the spectrum whose light-emission intensity is low by the spectrum ratio determined at Step 405 (Steps 407, 408).

As having been explained so far, when the two or more wavelengths, at which the light-emission intensities from plasma differ from each other significantly, are used for analyses of the characteristics of the processing or the state inside the processing chamber, a plurality of light-emission intensity spectra are acquired for which the accumulation time of a CCD sensor is set so that the light-emission intensities of the plurality of wavelengths become larger (substantially equal to or larger than one-half of the saturation capacity). With this configuration, the combined spectrum whose S/N ratio in a time variation in the light-emission intensities at a plurality of wavelengths to be used for the analysis is improved is recorded as an OES data.

By performing light-emission analyses using this combined spectrum, more accurate analysis results can be obtained. Also, by recording the combined spectrum as an OES data, although not illustrated, a storage area to a storage device such as hard disc can be reduced.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing apparatus for processing a processing-target film layer of a film structure including a plurality of film layers disposed in advance on a surface of a wafer mounted on a sample stage which is disposed within a processing chamber inside a vacuum vessel, by using plasma generated within the processing chamber, the plasma processing apparatus comprising: an optical receiver which receives lights of a plurality of wavelengths from an inside of the processing chamber during a plurality of different time intervals while processing is going; a detector which is configured to detect data intensities of lights of the plurality of wavelengths from output of the optical receiver using results of reception of lights during a plurality of different time-intervals by the optical receiver, and a spectrum combining unit, wherein the detector is configured to detect data indicating intensities of lights of the plurality of wavelengths during one part of the plurality of different time-intervals using the output from the optical receiver in which the intensity of light of only one of the plurality of wavelengths is not saturated, and to detect data indicating the intensities of lights of the plurality of the wavelengths during another part of the plurality of time-intervals using the output from the optical receiver in which the intensity of lights of each of the plurality of wavelengths is not saturated, and wherein the detector is further configured to detect data indicating the intensities of lights of the plurality of wavelengths using the result composed of a first data indicating the intensities of lights of the plurality of wavelengths during the one part of the plurality of the time-intervals and a second data indicating the intensity of light of the one of the plurality of wavelengths in which the intensity is not saturated during said another part of the plurality of time-intervals, and which data is configured to be multiplied by the spectrum combining unit a ratio of intensities of lights of the one of the plurality of wavelengths in the first data and in the second data.

2. The plasma processing apparatus according to claim 1, further comprising:
   a determining unit which determines an end point of the processing using the intensities of lights of the plurality of wavelengths detected from the detector.

3. The plasma processing apparatus according to claim 1, further comprising:
   an accumulation time setting unit that sets an alternating pattern of a longer time-interval and a shorter time-interval.

4. The plasma processing apparatus according to claim 1, further comprising:
   an end-point determining unit configured to detect an end-point with a signal-to-noise (S/N) ratio of at least 4.0.

* * * * *